United States Patent [19]

Waldron

[11] 4,136,291
[45] Jan. 23, 1979

[54] CAPACITIVE TOUCH-PAD DEVICES WITH DYNAMIC BIAS

[75] Inventor: Wesley K. Waldron, Scotia, N.Y.

[73] Assignee: General Electric Company, Schenectady, N.Y.

[21] Appl. No.: 799,345

[22] Filed: May 23, 1977

[51] Int. Cl.² .................. H03K 3/26; H03K 5/153; H01G 5/04
[52] U.S. Cl. .................. 307/308; 307/360; 361/280; 361/330
[58] Field of Search .................. 328/4; 307/308, 360; 331/65; 340/365 C; 361/278, 271, 280, 330

[56] References Cited

U.S. PATENT DOCUMENTS

| | | | |
|---|---|---|---|
| 3,826,979 | 7/1974 | Steinmann | 324/61 P |
| 3,986,110 | 10/1976 | Overall et al. | 324/61 P |
| 4,016,490 | 4/1977 | Weckenmann et al. | 324/61 P |

Primary Examiner—Stanley D. Miller, Jr.
Assistant Examiner—B. P. Davis
Attorney, Agent, or Firm—Geoffrey H. Krauss; Joseph T. Cohen; Marvin Snyder

[57] ABSTRACT

A dynamic biasing capacitance is formed between a transmitting electrode and a receiving electrode of a capacitive touch-pad device to couple a portion of the scan voltage signal into the sense node of a voltage comparator circuit, coupled to the receiving electrode, to offset the comparator circuit threshold voltage. The dynamic biasing capacitance may be formed by overlapping portions of the electrodes, with a dielectric layer positioned therebetween, or by the parasitic capacitance between aligned end surfaces of the two electrodes, with the magnitude of the dynamic biasing capacitance being adjusted by variation of interelectrode geometries.

11 Claims, 5 Drawing Figures

CAPACITIVE TOUCH-PAD DEVICES WITH DYNAMIC BIAS

BACKGROUND OF THE INVENTION

The present invention relates to capacitive touch-pad devices and, more particularly, to means for adjusting the output of a capacitive touch-pad device to match the threshold voltage of a comparator circuit used to sense the touch and no-touch conditions.

Known capacitive touch-pad devices have a pair of spatially-separated electrodes, commonly referred to as the transmitting electrode and the receiving electrode, fabricated upon a first surface of a dielectric layer, with a touch electrode fabricated upon the remaining surface of the dielectric layer and having an area enclosing the boundaries of the transmitting and receiving electrodes fabricated upon the opposite substrate surface. A source of a scanning voltage, commonly a voltage pulse, is coupled to the transmitting electrode and an input of a voltage comparator means is typically connected to the receiving electrode. A pair of series-connected capacitances (between the transmitting electrode and the touch electrode, and between the touch electrode and the receiving electrode) allow a certain proportion of the scan voltage to reach the voltage comparator input, when an object is not contacting or placed adjacent to the touch electrode; a different proportion of the scan voltage appears at the voltage comparator input when a relatively low impedance is placed between the touch electrode and a circuit ground. The comparator is configured to sense the change in signal amplitude at its input in the touch and in the no-touch conditions and to change the magnitude of its output accordingly.

The voltage comparator generally has a minimum threshold voltage which is typically greater in absolute value than the output signal from a capacitance touch-pad device which is activated by a relatively low scanning voltage, up to a magnitude of about 30 volts peak. Thus, the use of low scanning voltages, e.g. 30 volts peak or less, are not practical as the comparator input signal, in either the touch or no-touch condition is less than the minimum threshold voltage and the comparator remains in a single state in either condition.

It has been suggested to use direct current biasing techniques at the voltage comparator input to achieve an offset against the minimum threshold voltage and thereby reduce the threshold voltage to a value sufficiently small, to allow low amplitude scan voltages are usable. However, in the scanning mode, wherein excitation signals are applied to the transmitting electrode as a pulse occurring only at certain predetermined times, the voltage comparator input is typically reset to a fixed voltage level (to prevent false activation of the comparator output by noise and other extraneous signals occurring between scan pulses) and is released from the fixed voltage level immediately prior to the leading edge of the scan voltage pulse, whereby any D.C. bias introduced at the voltage comparator input would be rendered unusable by the comparator input reset circuit.

A dynamic biasing scheme which introduces a signal, offsetting the minimum threshold voltage, at the start of the scan voltage pulse will not be offset by the resetting of the comparator input and allows reduction in magnitude of the relatively high amplitude scan voltages presently utilized, thus reducing the cost of the electronics associated with the capacitive touch-pad device.

BRIEF SUMMARY OF THE INVENTION

In accordance with the invention, a capacitive touch-pad device having dynamic biasing means comprises a dielectric substrate having a touch electrode fabricated on a first surface and having spatially-separated transmitting and receiving electrodes fabricated upon the remaining surface and positioned opposite the touch electrode and within the boundaries of the latter; a portion of one of the receiving and transmitting electrodes is geometrically configured to provide a predetermined value of capacitance between the transmitting and receiving electrodes to facilitate coupling of a proportional amount of the scan voltage pulse directly to the comparator input to offset the threshold voltage thereof.

In one preferred embodiment, the dynamic biasing capacitance is of multilayer configuration and is formed by overlapping a portion of one of the receiving and transmitting electrodes over the other of the electrodes with a layer of dielectric therebetween.

In another preferred embodiment, at least one portion of one of the receiving and transmitting electrodes is configured to have an edge thereof extending at lesser or greater length adjacent to at least one edge of the remaining one of the electrodes to provide greater or lesser capacitance, with an air dielectric in the space therebetween; dielectric material having a dielectric constant differing from the dielectric constant of air, may be utilized to achieve a desired value of dynamic biasing capacitance.

Accordingly, it is one object of the present invention to provide a capacitive touch-pad device having dynamic biasing means for substantially reducing the threshold voltage of a comparator coupled to the device.

It is another object of the present invention to provide a capacitive touch-pad device with a dynamic biasing means to facilitate scanning of the device with relatively low voltage signals.

These and other objects of the present invention will become apparent upon consideration of the following detailed description taken in conjunction with the drawings.

DETAILED DESCRIPTION OF THE INVENTION

Figure 2A:
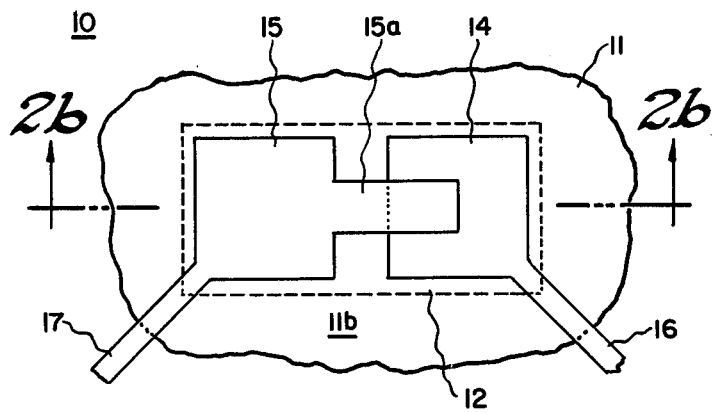
FIGS. 2a and 2b are a plan view and a sectional view, respectively, of one preferred embodiment of the novel capacitive touch-pad device with dynamic biasing means of the present invention.
Figure 2B:
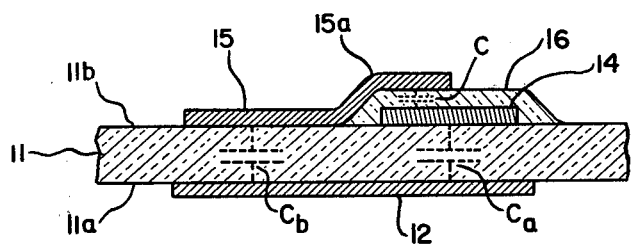
Figure 1:
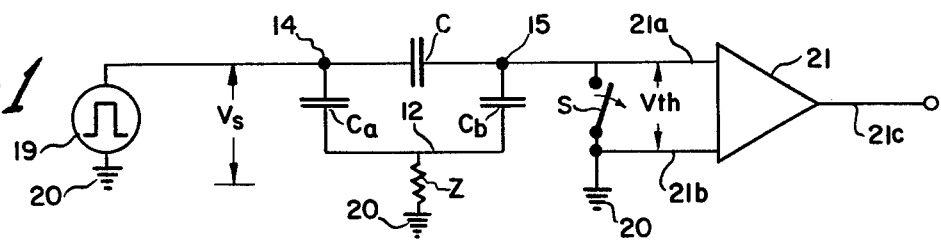
FIG. 1 is a schematic diagram illustrating the principles of operation of the present invention.

Referring initially to FIGS. 1, 2a and 2b, a first preferred embodiment of a capacitive touch-pad device 10 comprises a substrate 11 of a dielectric material having a conductive touch electrode 12 fabricated upon a first surface 11a thereof. A pair of electrodes 14 and 15, commonly referred to as a transmitting electrode and a receiving electrode, respectively, are fabricated upon the remaining, or inwardly-facing, surface 11b of the substrate. Electrodes 14 and 15 are configured and positioned to be substantially within the boundaries defined by touch electrode 12 upon the opposite surface of the dielectric substrate. A layer 16 of dielectric material is fabricated over one of the transmitting and receiving electrodes, e.g. transmitting electrode 14, to provide an insulative supporting surface for an extension 15a of the remaining electrode, whereby a capacitance of magnitude C is formed between electrode extension 15a and the underlying portion of the remaining electrode 14. Capacitance C is generally of lesser magnitude than either of the capacitance $C_a$ formed between transmitting electrode 14 and the underlying touch electrode 12, and capacitance $C_b$ formed between touch electrode 12 and the overlying receiving electrode 15. By fabricating the multilayered combination of electrodes 14 and 15, a dielectric layer 16 and electrode extension 15a by thin film techniques, the magnitude of overlap between electrode 14 and extension 15a is relatively easily changed to facilitate adjustment of the value of capacitance C.

Use of thin film fabrication techniques is particularly advantageous in that a pair of lead means 16 and 17, each coupled to one of electrodes 14 and 15, respectively, can be integrally fabricated with the planar electrodes prior to enclosing at least one of the electrodes, e.g. electrode 14, in dielectric layer 16.

In operation, a scan voltage source 19, producing a voltage pulse of amplitude $V_s$ at predetermined periodic intervals, is coupled between transmitting electrode 14 and a circuit ground 20. A voltage comparator 21 has a first input 21a coupled to receiving electrode 15 and has a second input 21b coupled to circuit ground. Prior to receiving scan voltage pulse, a switch S (coupled between comparator input leads 21a and 21b) is closed to prevent noise and other extraneous signals from triggering the comparator and enabling the output 21c thereof. At the time that transmitting electrode 14 receives the scan voltage pulse, switch S is opened and a minimal threshold voltage of magnitude $V_{th}$ appears between comparator input terminals 21a and 21b. If a relatively high impedance Z exists between touch electrode 12 and circuit ground 20, a portion of the scan voltage $V_s$ is coupled to the comparator input via the series capacitance arrangement of capacitors $C_a$ and $C_b$, while an additional portion of the scan voltage pulse is coupled by dynamic biasing capacitance C between source 19 and comparator input 21a. As previously stated herein, the value of dynamic biasing capacitance C is adjusted to supply a portion of the scan voltage pulse to the comparator input to reduce the threshold voltage substantially to zero, whereby the comparator now senses only the absolute value of the signal coupled to its input via the touch pad capacitors $C_a$ and $C_b$; a high value of impedance Z allows a relatively large touch-pad voltage to appear at the comparator and maintain comparator output 21c in the disabled condition. If a relatively low magnitude of impedance Z occurs between touch plate 12 and ground, the signal coupled to the comparator input via series capacitors $C_a$ and $C_b$ is drastically reduced, whereby only the dynamic biasing capacitor C couples a signal to the comparator input of sufficient magnitude to overcome the threshold voltage. This relatively low voltage at the comparator input is sensed to enable comparator output 21c even when relatively low amplitude scan voltages are utilized.

Figure 3A:
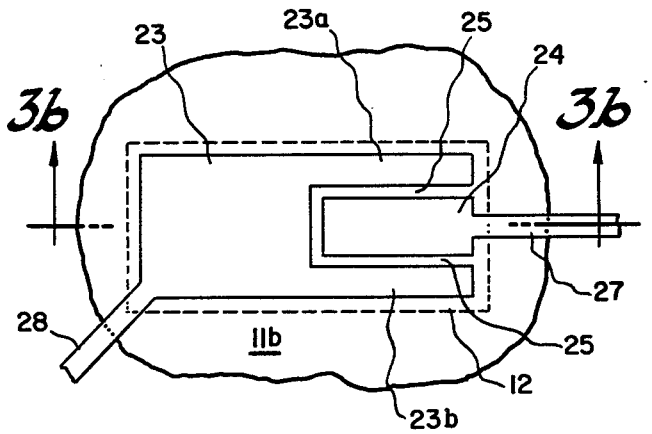
FIGS. 3a and 3b are a plan view and a sectional view, respectively, of another preferred embodiment of the present invention.
Figure 3B:
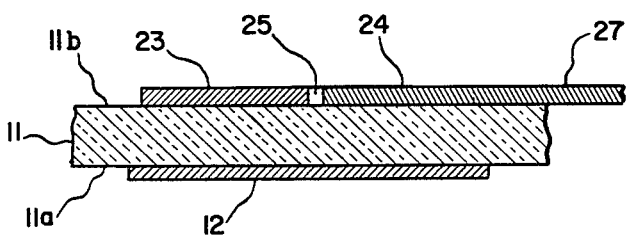

Referring now to FIGS. 3a and 3b, another preferred embodiment 10' of a capacitive touch-pad device with dynamic biasing means is shown. Touch electrode 12, having been fabricated upon the outwardly-facing surface 11a of the dielectric substrate 11, provides the boundaries within which a transmitting electrode 23 and a receiving electrode 24 are fabricated in planar manner, preferably by use of thin film techniques. One of electrodes 23 and 24 is of smaller area, e.g. electrode 24, than the other, whereby the large electrode may be fabricated with at least one, and preferably a pair, of electrode extensions 23a and 23b extending adjacent to the boundaries of the smaller electrode. A channel 25 is formed between the adjacent edges of the two electrodes to provide insulation therebetween. Thus, the dynamic biasing capacitance C is formed as a fringing capacitance between the edges of the two, relatively closely spaced electrodes. Channel 25 may be filled with air or may be filled with a solid dielectric material having a dielectric constant differing from that of air, to increase or reduce the capacitance per unit length of the confronting edges.

As previously explained hereinabove, electrode leads, such as a receiving electrode lead means 27 and a transmitting electrode lead means 28, may be fabricated integral with, and at the same time as, the pair of electrodes and the electrode extensions. This planar electrode-extension-lead approach is less costly to fabricate than the multilayer embodiment of FIGS. 2a and 2b and also provides a certain degree of electrical shielding for electrode 24.

It should be understood that, in either preferred embodiment, the transmitting and receiving electrodes may be interchanged, although electrode 24, being shielded by electrode extensions 23a and 23b, is best connected as the receiving electrode in many applications.

While several preferred embodiments of the present invention have been dscribed, many variations and modifications will now become apparent to those skilled in the art. It is my intent, therefore, to be limited solely by the scope of the appending claims.

What is claimed is:

1. A capacitive touch pad device comprising:
   a substrate of dielectric material having first and second opposed surfaces;
   a single conductive touch electrode responsive to human communication fabricated upon said first surface over a preselected continuous area;
   a pair of spatially separated electrodes fabricated upon said second surface substantially within an area overlying and bounded by the area of said touch electrode;
   at least one of said pair of electrodes having at least one extension therefrom extending parallel to and spaced from at least one surface of the remaining one of said pair of electrodes; and
   dielectric material filling the volume defined between said electrode extension and the confronting portion of said remaining electrode to provide a first electrical capacitance therebetween of essentially constant value;
   the dielectric material of said substrate separating said conductive touch electrode and each of said spatially separated electrodes providing second and third electrical capacitances respectively therebetween of essentially constant value.

2. A device as set forth in claim 1, wherein the dielectric material between said electrode extension and said remaining electrode is air.

3. A device as set forth in claim 1, wherein the dielectric material between said electrode extension and said remaining electrode has a dielectric constant differing from the dielectric constant of air.

4. A device as set forth in claim 1, wherein said pair of electrodes are planar arranged, said electrode extension being positioned above the plane of said electrodes and extending over a predetermined area of said remaining electrode; the volume between confronting surfaces of said electrode extension and said remaining electrode being filled with a solid dielectric material.

5. A device as set forth in claim 4, wherein said remaining electrode is completely enclosed by solid dielectric material.

6. A device as set forth in claim 5, wherein said pair of electrodes and said electrode extension are thin film members.

7. A device as set forth in claim 1, wherein said pair of electrodes are coplanar, each of said extension electrodes lying in the same plane thereof and having an edge extending adjacent to at least one edge of said remaining electrode.

8. A device as set forth in claim 1, further comprising lead means coupled to each of said pair of electrodes.

9. A device as set forth in claim 8, wherein said lead means are thin film members integrally fabricated as part of the associated one of said pair of electrodes.

10. A device as set forth in claim 1 in combination with: first means coupled to only one of said pair of electrodes for generating a signal; second means coupled to the remaining one of said electrodes for comparing, against a reference signal amplitude, the amplitude of the signal at said remaining electrode produced responsive to the signal from said first means, said second means having a threshold signal amplitude; and the magnitude of said capacitance between said pair of electrodes being adjusted to supply said second means with a portion of the signal from said first means selected to offset said threshold signal amplitude.

11. A combination as set forth in claim 10, wherein the signal from said first means is periodically applied to said device; and wherein an input of said second means is substantially short-circuited at all time intervals when said first means signal is not present at said device.

* * * * *